(12) United States Patent
Vanderzande et al.

(10) Patent No.: US 6,936,683 B1
(45) Date of Patent: Aug. 30, 2005

(54) METHOD OF PRODUCING DERIVATIVES OF POLYARYLENE VINYLENE

(75) Inventors: Dirk Vanderzande, Bilzen (BE); Joanes Gelan, Genk (BE); Albert van Breemen, Eindhoven (BE); Michael Van Der Borght, Turnhout (BE); Anna Issaris, Kuringen (BE); Laurence Lutsen, Coudekerque-Branche (FR); Margreet de Kok, Eindhoven (NL); Willi Kreuder, Mainz (DE)

(73) Assignee: Covion Organic Semiconductor GmbH (DE)

( * ) Notice: Subject to any disclaimer, the term of this patent is extended or adjusted under 35 U.S.C. 154(b) by 0 days.

(21) Appl. No.: 09/868,212

(22) PCT Filed: Nov. 17, 1999

(86) PCT No.: PCT/EP99/08830

§ 371 (c)(1),
(2), (4) Date: Jul. 30, 2001

(87) PCT Pub. No.: WO00/35987

PCT Pub. Date: Jun. 22, 2000

(30) Foreign Application Priority Data

Dec. 15, 1998 (DE) .......................... 198 57 661

(51) Int. Cl.⁷ .................. C08G 75/00; C08F 283/00
(52) U.S. Cl. .................. 528/391; 528/171; 528/495; 525/535
(58) Field of Search ................ 528/391, 171, 528/495, 86; 525/535

(56) References Cited

U.S. PATENT DOCUMENTS

| | | | |
|---|---|---|---|
| 4,766,198 A | 8/1988 | Harper et al. | 528/377 |
| 5,763,539 A | 6/1998 | Stern et al. | 525/535 |

FOREIGN PATENT DOCUMENTS

| | | |
|---|---|---|
| EP | 705 857 | 4/1996 |
| WO | 91/15534 | 10/1991 |

OTHER PUBLICATIONS

Issaris A. et al., "Polyermization of a P–quinodimethane Derivative to a Precursor of Poly(P–phenylene Vinylene)—Indication For a Free Radical Mechanism", *Polymer, GB, Elsevier Science Publishers B.V.*, Bd. 38, No. 10, pp. 2571–2574 (May 1, 1997).

Vanderzande, D.J. et al., "A General Approach to Precursors for Poly(Arylene Vinylene) Derivatives: Mechanism, Scope and Modifications" *Macromolecular Symposia, DE, Wiley VCH, Weinheim*, Bd. 125, pp. 189–203 (Jan. 1, 1998).

*Primary Examiner*—Duc Truong
(74) *Attorney, Agent, or Firm*—Connolly Bove Lodge & Hutz LLP

(57) ABSTRACT

The present invention relates to a selected process for the preparation of polyarylenevinylenes. These conjugated polymers are suitable for electroluminescence applications.

20 Claims, No Drawings

METHOD OF PRODUCING DERIVATIVES OF POLYARYLENE VINYLENE

The present invention relates to a process for the preparation of derivatives of polyarylenevinylenes. These conjugated polymers are suitable, inter alia, for electroluminescence applications.

There is considerable industrial demand for large-area solid-state light sources for a number of applications, predominantly in the area of display elements, display-screen technology and illumination technology. The requirements made of these light sources cannot at present be completely satisfied by any of the existing technologies.

As an alternative to conventional display and illumination elements, such as incandescent lamps, gas-discharge lamps and non-self-illuminating liquid-crystal display elements, electroluminescent (EL) materials and devices, such as light-emitting diodes (LEDs), have already been in use for some time.

Besides inorganic electroluminescent materials and devices, low-molecular-weight, organic electroluminescent materials and devices have also been known for about 30 years (see, for example, U.S. Pat. No. 3,172,862). Until recently, however, such devices were greatly limited in their practical applicability.

EP-A-0 423 283 and EP-A-0 443 861 describe electroluminescent devices which contain a film of a conjugated polymer as light-emitting layer (semiconductor layer). Such devices offer numerous advantages, such as the possibility of manufacturing large-area, flexible displays simply and inexpensively. In contrast to liquid-crystal displays, electroluminescent displays are self-illuminating and therefore do not require an additional illumination source at the back.

A typical device in accordance with EP-A-0 423 283 consists of a light-emitting layer in the form of a thin, dense polymer film (semiconductor layer) containing at least one conjugated polymer. A first contact layer is in contact with a first surface, and a second contact layer is in contact with a further surface of the semiconductor layer. The polymer film of the semiconductor layer has a sufficiently low concentration of extrinsic charge carriers so that, on application of an electric field between the two contact layers, charge carriers are introduced into the semiconductor layer, the first contact layer becoming positive compared with the other layer, and the semiconductor layer emits radiation. The polymers used in such devices are conjugated. The term "conjugated polymer" is taken to mean a polymer which has a delocalized electron system along the main chain. The delocalized electron system gives the polymer semiconductor properties and enables it to transport positive and/or negative charge carriers with high mobility.

EP-A-0 423 283 and EP-A-0 443 861 describe poly(p-phenylenevinylene) as polymeric material for the light-emitting layer. This can be modified by alkyl, alkoxy, halogen or nitro substituents on the aromatic ring. Such polymers have since then been investigated in a large number of studies, and dialkoxy-substituted PPVs in particular have already been optimized to a considerable extent toward the market introduction stage (cf., for example, J. Salbeck, Ber. Bunsenges. Phys. Chem. 1996, 100, 1667). However, the development of such polymers can in no way be regarded as complete. Thus, inter alia, improvements are still necessary regarding the service life, stability and also the achievable color. For example, the above polymer class which has been developed the furthest, dialkoxy-PPVs, is only suitable for emission of orange-red light.

The above polymers are only accessible in unsatisfactory yields. Typical polymerizations typically give yields of only 70% of theory, frequently even only less than 50%.

There is therefore a great demand for economical processes for the preparation of polyarylenevinylenes.

The present invention relates to a process for the preparation of polymers of the formula (I)

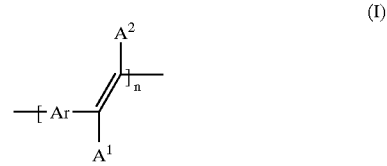

in which Ar can adopt the meaning $Ar^1$ and/or $Ar^2$ and
$Ar^1$ is an aromatic ring system having 4 to 20 carbon atoms, which may, if desired, be monosubstituted or polysubstituted by $C_1$–$C_{20}$-alkyl, $C_1$–$C_{20}$-alkoxy, $C_3$–$C_{20}$-branched alkyl, phenyl or benzyl radicals and which may contain up to 4 heteroatoms from the group consisting of oxygen, sulfur and nitrogen in the aromatic ring system,
$Ar^2$ is a radical of the formula

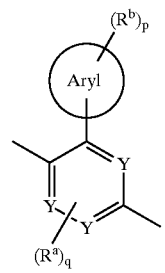

in which
Y are identical or different and are CH or N;
Aryl is an aryl group having 4 to 14 carbon atoms;
$R^a$ and $R^b$ are identical or different and are a straight-chain or branched or cyclic alkyl or alkoxy group having 1 to 20 carbon atoms, in which one or more non-adjacent $CH_2$ groups may be replaced by —O—, —S—, —CO—, —COO—, —O—CO—, —$NR^1$—, —$(NR^2R^3)^+$—$A^-$, or —$CONR^4$— and in which one or more H atoms may be replaced by F, or are CN, F, Cl or an aryl group having 4 to 14 carbon atoms, which may be substituted by one or more non-aromatic radicals $R^a$;
$R^1$, $R^2$, $R^3$ and $R^4$ are identical or different and are aliphatic or aromatic hydrocarbon radicals having 1 to 20 carbon atoms or are alternatively H;
$A^-$ is a singly charged anion or an equivalent thereof;
q is 0, 1 or 2;
p is 1, 2, 3, 4 or 5;
$A^1$ and $A^2$ are identical or different and are hydrogen or a $C_1$- to $C_{20}$-carbon-containing group; and
n is from 5 to 50,000, preferably from 10 to 20,000, in particular from 10 to 15,000;
comprising the following measures:
a) reaction of at least one monomer of the formula (II)

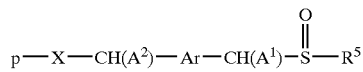

in which
Ar is as defined under the formula (1),
X is a leaving group, and
$R^5$ is unbranched alkyl having 1 to 20 carbon atoms, branched alkyl having 3 to 20 carbon atoms, cyclic alkyl, such as cyclohexyl, or $C_1$–$C_4$-alkyl-substituted cyclic alkyl, such as cyclohexylmethyl, phenyl or benzyl, which may be substituted or unsubstituted and/or contain heteroatoms, such as O, N and Si, with a base in the presence of an alcohol as solvent, to give the compound of the formula (III)

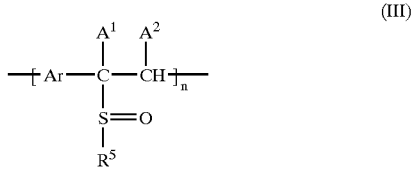
(III)

in which Ar, $A^1$, $A^2$, $R^5$ and n are as defined above, b) warming of the compound of the formula (III) with formation of a polymeric compound of the formula (I), which comprises employing a secondary or tertiary alcohol having at least 4 carbon atoms as the alcohol in measure a).

The radical X is preferably a leaving group, such as halogen, —O-tosylate, —O-mesylate or —O-trifluoroacetate.

In the formula (I), p denotes para in respect of the two methylene radicals —$CH_2$— on both sides of the radical Ar.

The process according to the invention is preferably used for the preparation of compounds of the formula (I) in which Ar is the structural unit

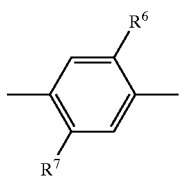

in which $R^6$ and $R^7$ are identical or different and are hydrogen, an unbranched alkyl or alkoxy radical having 1 to 20 carbon atoms, a branched alkyl or alkoxy radical having 1 to 20 carbon atoms, phenyl or benzyl, where the abovementioned radicals may be unsubstituted or substituted, halogen, in particular chlorine, bromine or fluorine, cyano, nitro, or an ester having 1 to 20 carbon atoms.

Particular preference is given to compounds of the formula (I) in which Ar is as defined above, and $R^6$ and $R^7$, independently of one another, are an unbranched alkoxy radical having 1 to 20 carbon atoms, a branched alkoxy radical having 1 to 20 carbon atoms, phenyl or benzyl, where the abovementioned radicals may be unsubstituted or substituted, halogen, in particular chlorine, bromine or fluorine, cyano, nitro, or an ester having 1 to 20 carbon atoms.

Preference is furthermore given to compounds of the formula (I) in which $R^6$ and $R^7$, independently of one another, are an unbranched alkoxy radical having 1 to 10 carbon atoms, a branched alkoxy radical having 3 to 20 carbon atoms, or phenyl, which may be substituted by one or more branched or unbranched alkyl or alkoxy groups having up to 20 carbon atoms.

$R^5$ is preferably n-, i-, s- or t-butyl, i-pentyl, octyl, 3,6,9-trioxadecyl, 2-hydroxyethyl or 2-chloroethyl, particularly n-butyl or n-octyl.

The process according to the invention is equally preferably used for the preparation of compounds of the formula (I) in which Ar is the structural unit

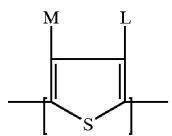

in which

M and L are identical or different and are hydrogen, an unbranched alkyl or alkoxy radical having 1 to 16 carbon atoms, a branched alkyl or alkoxy radical having 3 to 16 carbon atoms, phenyl or benzyl, where the abovementioned radicals may be unsubstituted or substituted, halogen, in particular chlorine, bromine or fluorine, cyano, nitro, or an ester having 1 to 16 carbon atoms, or M and L together are a bridge having at least 4 bridge members, which may also contain one or more heteroatoms, in particular oxygen and/or sulfur.

The preparation of the monomeric compounds of the formula (II) is described in German Patent Application 19840943.5.

The secondary and/or tertiary alcohols employed in accordance with the invention are, in particular, alcohols having at least 4 carbon atoms whose boiling point at atmospheric pressure is <300° C. Particular preference is given to s-butanol, 2-pentanol, 3-pentanol, 3-methyl-2-butanol, 2-methyl-2-butanol, 2,3-butanediol, 2-octanol, 3-octanol, 2-methyl-2-hexanol, 2-methyl-3-hexanol, 5-methyl-2-hexanol, cyclohexanol, regio- and stereoisomers of methylcyclohexanol, 1-methylcyclohexanol, t-butanol and 2-phenyl-2-propanol, mixtures frequently also being advantageous, in particular if, as in the case of t-butanol, the pure solvent is a solid at room temperature.

Measure b) can be carried out either without solvent, for example in a cast or dried film, or alternatively in a solution, i.e. in the presence of a solvent. The type of this solvent can be selected from the group consisting of inert solvents, such as aromatic aromatic solvents, such as chlorobenzene, xylenes and toluene. Toluene has proven particularly suitable. A further group of inert solvents are ethers, for example t-butyl methyl ether and di-n-butyl ether, and cyclic ethers, such as dioxane, tetrahydropyran, tetrahydrofuran and anisole, which are particularly suitable. Also suitable are ketones (acetone, butanone, cyclopentanone and cyclohexanone), sulfones (DMSO), nitriles (acetonitrile and benzonitrile), esters (butyl acetate and methyl benzoate), lactones (butyrolactone), amides (DMF and N-methylformamide) and lactams (NMP and N-methylcaprolactam).

Solvents having various functionalities, such as ethyl cyanoacetate and 2-methoxyethyl acetate, can also advantageously be used.

Preference is also given to the specific alcohols listed under measure a). Even polar, protic solvents, such as n-butanol, n-propanol, ethanol, methanol and water, can advantageously be employed.

Mixtures of the abovementioned solvents can frequently also advantageously be used, particular preference being given to homogeneously miscible solvents. In an economically particularly attractive embodiment, measure b) is carried out in situ, i.e. in the same solvent in which measure a) is also carried out, it being possible, if desired, for the concentration to be modified by evaporation or dilution.

The pressure during both reaction steps is of secondary importance and depends especially on the vapor pressure of the solvent at the selected temperature.

In measures a) and b), the exclusion of oxygen is ensured by flushing with an inert gas, such as nitrogen or argon.

Suitable bases for measure a) are inorganic and organic bases. Suitable inorganic bases are NaOH, KOH and LiOH. Suitable organic bases are sterically hindered bases, such as lithium diisopropylamide (LDA), sodium trimethylsilanoate, bis(trimethylsilyl)potassium amide, but in particular alkali metal tert-butoxides, such as KOtBu, NaOtBu and the Na and K alkoxides of the alcohols used as solvent. Commercially available NaOtBu gives particularly good results.

The amount of base employed can vary greatly, it being possible to employ up to 8 equivalents of base per mole of monomer of the formula (II). However, it is preferred to employ from 0.85 to 1.6 equivalents of base, in particular from 0.95 to 1.05 equivalents, per mole of monomer of the formula (II). This ratio proves to be particularly advantageous since the excess amount of base can in part only be removed from the final product with considerable effort.

The reaction temperatures and times for measure b) can be varied over a broad range, with a higher temperature generally being selected for a shorter reaction time. At temperatures of up to +200° C., the reaction times should be selected between 5 minutes and 48 hours. Preference is given to temperatures above 60° C., the reaction particularly preferably being carried out at the boiling point of the solvent used.

With the aid of the process according to the invention, the yields of compounds of the formula (I), based on the monomer of the formula (II) employed, are significantly increased and are more than 80%, preferably even more than 85% of theory.

EXAMPLES

All reactions were carried out under nitrogen.

Molecular weights were determined by gel permeation chromatography (GPC) in THF against polystyrene standard (PS).

Example 1

Polymerization of 4-(octylsulfinylmethyl)-3-methoxy-6-(3,7-dimethyloctyloxy)-benzyl Chloride and 4-(octylsulfinylmethyl)-6-methoxy-3-(3,7-dimethyl-octyloxy)benzyl Chloride to Give a Precursor Polymer 2 mmol of the monomer in 14 ml of s-butanol were degassed by passing a stream of nitrogen through for one hour. A solution or suspension of sodium t-butoxide (0.25 g, 2.6 mmol) in 6 ml of s-butanol was added in one portion. One hour later, the reaction solution was added dropwise with vigorous stirring to 200 ml of ice-water. The mixture was neutralized using 1N hydrochloric acid and extracted three times with 100 ml of chloroform each time. After concentration under reduced pressure, the crude product was taken up in 12.5 g of chloroform, and the solution was added dropwise to 125 g of a precipitant, i.e. a mixture of n-hexane and diethyl ether (1:1, w/w). The precipitated precursor polymer was filtered off with suction, rinsed with the precipitant and dried under reduced pressure.

The yield was virtually quantitative.

GPC: $\bar{0}_w$=307,000, polydispersity 2.1

Conversion of the Precursor Polymer:

Poly[2-methoxy-5-(3,7-dimethyloctyloxy) phenylene-1,4-vinylene-co-5-methoxy-2-(3,7-dimethyloctyloxy)phenylene-1,4-vinylene]

The precursor polymer was refluxed for 3 hours in 50 ml of toluene (110° C.). After precipitation in 300 ml of methanol, 3.6 g of the conjugated polymer were obtained. Yield 98%, based on the monomer employed in Example 1.

GPC: $\bar{0}_w$=560,000, polydispersity 3.8

Comparative Example 1

2 g (4.6 mmol) of a 1:1 mixture of the isomers α-chloro-α'-n-butylsulfinyl-2-(3,7-dimethyloctyloxy)-5-methoxy-p-xylene and α-chloro-α'-n-butylsulfinyl-2-methoxy-5-(3,7-dimethyloctyloxy)-p-xylene were dissolved in 25 ml of NMP, and the solution was flushed with nitrogen for one hour. 0.468 g (4.87 mmol, 1.05 eq.) of NaOtBu was dissolved in 20 ml of s-BuOH, and the solution was flushed with nitrogen for one hour. The NaOtBu solution was added at 23° C. to the solution of the monomer. One hour later, the mixture was added to 100 ml of H$_2$O and neutralized using 0.1N HCl. The aqueous phase was extracted with 100 ml of chloroform. The organic phase was dried over MgSO$_4$ and evaporated under reduced pressure, giving 0.36 g of the crude, intense yellow precursor polymer.

Conversion of the Precursor Polymer

Heating in 50 ml of boiling toluene (110° C., 3 hours) and precipitation in 300 ml of methanol gave 0.28 g (14%) of the conjugated polymer.

GPC: $\bar{0}_w$=654,000, PD=5.3.

Example 2

7 g (0.0162 mol) of a 1:1 mixture of the isomers α-chloro-α'-n-butylsulfinyl-2-(3,7-dimethyloctyloxy)-5-methoxy-p-xylene and α-chloro-α'-n-butylsulfinyl-2-methoxy-5-(3,7-dimethyloctyloxy)-p-xylene were dissolved in 60 ml of s-BuOH in a 250 ml three-necked flask and flushed with nitrogen. A likewise oxygen-free solution of 2.04 g of NaOtBu (0.0214 mol) in 60 ml of s-BuOH was added to the solution at 23° C., and, after one hour, the solution was added dropwise to 300 ml of H$_2$O. After neutralization using 0.1N HCl, the aqueous phase was extracted with 200 ml of chloroform. The organic phase was concentrated over MgSO$_4$ under reduced pressure, giving 6 g (0.0151 mmol=93%) of the precursor polymer.

GPC: $M_p$=2.18×10$^5$; $\bar{0}_w$=3.07×10$^5$; $\bar{0}_n$=1.47×10$^5$; PD=2.08.

Conversion of the Precursor Polymer

Treatment for 3 hours in 50 ml of boiling toluene (110° C.) and precipitation in 300 ml of methanol gave 3.9 g (0.0135 mol=83%) of the conjugated polymer.

GPC: $M_p$=4.42×10$^5$; $\bar{0}_w$=5.60×10$^5$; $\bar{0}_n$=1.47×10$^5$; D=3.80.

Examples 3–5 and Comparative Examples 2–11

Polymerization of α-chloro-α'-octylsulfinyl-p-xylene 2 mmol of the monomer were dissolved in 14 ml of a solvent and degassed by passing nitrogen through for one hour. A solution or suspension, likewise degassed at 30° C., of sodium t-butoxide (0.25 g, 2.6 mmol) in 6 ml of the same solvent was added in one portion at 30° C. One hour later, the reaction mixture was added dropwise to 200 ml of ice-water with vigorous stirring. The mixture was neutralized using 1N hydrochloric acid and extracted three times with 100 ml of chloroform each time. After concentration under reduced pressure, the crude product was taken up in 12.5 g of chloroform, and the solution was added dropwise to 125 g of a precipitant, i.e. a mixture of n-hexane and diethyl ether (1:1, w/w). The precipitated precursor polymer was filtered off with suction, rinsed with the precipitant and dried under reduced pressure.

| Example | Solvent | Yield of precursor polymer (%) | Non-polymeric products (%) | $\bar{0}_w$ (×10³) | PD |
|---|---|---|---|---|---|
| Comp. 2 | CH$_2$Cl$_2$ | 76 | 12 | 350 | 2.4 |
| Comp. 3 | THF | 81 | 12 | 735 | 3.9 |
| Comp. 4 | DMSO | 49 | 41 | 475 | 4.0 |
| Comp. 5 | MMF | 28 | 69 | 780 | 3.0 |
| Ex. 3 | s-BuOH | 88 | 8 | 238 | 2.0 |
| Comp. 6 | MeOH | 0 | 100 | — | — |
| Comp. 7 | EtOH | 11 | 87 | 104 | 1.7 |
| Comp. 8 | n-PrOH | 30 | 62 | 118 | 1.7 |
| Comp. 9 | n-BuOH | 28 | 65 | 104 | 1.7 |
| Comp. 10 | n-PentOH | 42 | 56 | 84 | 1.7 |
| Comp. 11 | i-PrOH | 21 | 78 | 437 | 2.3 |
| Ex. 4 | t-BuOH | 89 | 4 | 225 | 2.1 |
| Ex. 5 | s-PentOH | 89 | 5 | 296 | 2.4 |

MMF = monomethylformamide

Examples 6–12

Polymerization of Various α-chloro-α'-alkylsulfinyl-p-xylenes in s-butanol Under the Conditions as in Example 3

| | | Precursor polymer yield (%) | $\bar{0}_w$ (×10³) | PD |
|---|---|---|---|---|
| Example 6 | R = n-butyl | 82 | 540 | 2.5 |
| Example 7 | R = n-octyl | 88 | 238 | 2.0 |
| Example 8 | R = i-butyl | 82 | 280 | 2.2 |
| Example 9 | R = i-pentyl | 83 | 500 | 2.3 |
| Example 10 | R = s-Bu | 78 | 260 | 2.2 |
| Example 11 | R = t-Bu | 77 | 42 | 1.9 |
| Example 12 | (ethoxypropyl structure) | >49[b] | 435 | 2.2 |

[b]Yield: 80% before precipitation. FIGURE relates to isolated polymer. Residues are in the liquor.

Examples 13–14 and Comparative Examples 12–15

Polymerization of α-chloro-α'-n-butylsulfinyl-2,5-dimethyl-p-xylene Under the Conditions as in Example 3

| | Solvent | T (° C.) | Eq. of base | $\bar{0}_w$ (×10³) | PD | Yield (%) |
|---|---|---|---|---|---|---|
| Comp. 12 | Monomethylformamide (MMF) | 20 | 1.3 | 620 | 2.9 | 25 |
| Comp. 13 | MMF:CH$_2$Cl$_2$ (3:2) | 20 | 1.3 | 632 | 2.6 | 25 |
| Comp. 14 | Formamide:THF (3:1) | 20 | 1.3 | 390 | 2.4 | 20 |
| Comp. 15 | NMP | −10 | 1.3 | 192 | 1.9 | 55 |
| Ex. 13 | t-Butanol | 20 | 1.3 | 177 | 1.9 | 85 |
| Ex. 14 | s-Butanol | 20 | 1.3 | 773 | 2.6 | 90 |

Example 15 and Comparative Examples 16–17

Polymerization of α-chloro-α'-n-butylsulfinyl-2,5-dimethoxy-p-xylene Under the Conditions as in Example 3

| | Solvent | T (° C.) | Eq. of base | $\bar{0}_w$ (×10³) | PD | Yield (%) |
|---|---|---|---|---|---|---|
| Comp. 16 | MMF | 20 | 1.3 | 267 | 1.8 | 35 |
| Comp. 17 | NMP | −10 | 1.3 | 90 | 1.7 | 30 |
| Ex. 15 | s-Butanol | 20 | 1.3 | 133 | 1.9 | 75 |

Example 16

Polymerization of α-chloro-α'-n-butylsulfinyl-2,5-chloro-p-xylene Under the Conditions as in Example 3

At T=20° C., 65% of the corresponding precursor polymer with 1.3 base equivalents were obtained, having an Mw of 678,000 g/mol in GPC and a PD of 3.3.

Example 17

Polymerization of α-chloro-α'-butylsulfinyl-p-xylene 10.2 g (0.106 mol) of NaOtBu dissolved in 240 ml of s-butanol were poured in one portion into a mechanically stirred solution of 20 g (0.082 mol) of α-chloro-α'-butylsulfinyl-p-xylene in 570 ml of s-butanol. After stirring for a further 60 minutes, the mixture was poured into 1.5 l of ice-water, neutralized using 1N HCl and extracted with CHCl$_3$. The latter was distilled off under reduced pressure, the residue was taken up in CHCl$_3$, and the product was precipitated in diethyl ether.

The white solid dried under reduced pressure gave 14.7 g (86%) of precursor polymer.

A storage experiment in the freezer at −18° C. showed no discoloration, no weight change and no odor nuisance.

What is claimed is:

1. A process for the preparation of polymers of the formula (I)

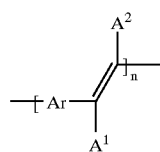

in which Ar is $Ar^1$ or $Ar^2$ and $Ar^1$ is an aromatic ring system having 4 to 20 carbon atoms, which is optionally monosubstituted or polysubstituted by $C_1$–$C_{20}$-alkyl, $C_1$–$C_{20}$-alkoxy, $C_3$–$C_{20}$-branched alkyl, phenyl or benzyl radicals and which further optionally contains up to 4 heteroatoms selected from the group consisting of oxygen, sulfur and nitrogen in the aromatic ring system, is a radical of the formula

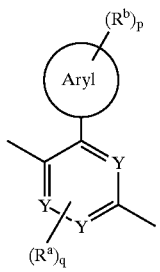

in which

Y are identical or different and are CH or N;

Aryl is an aryl group having 4 to 14 carbon atoms;

$R^a$ and $R^b$ are identical or different and are a straight-chain or branched or cyclic alkyl or alkoxy group having 1 to 20 carbon atoms, in which one or more non-adjacent $CH_2$ groups is optionally replaced by —O—, —S—, —CO—, —COO—, —O—CO—, —$NR^1$—, —$(NR^2R^3)^+$—$A^-$ or —$CONR^4$— and in which one or more H atoms is optionally replaced by F, or are CN, F, Cl or an aryl group having 4 to 14 carbon atoms, which is optionally substituted by one or more non-aromatic radicals $R^a$;

$R^1$, $R^2$, $R^3$ and $R^4$ are identical or different and are aliphatic or aromatic hydrocarbon radicals having 1 to 20 carbon atoms or are alternatively H;

$A^-$ is a singly charged anion or an equivalent thereof;

q is 0, 1 or 2;

p is 1, 2, 3, 4 or 5;

$A^1$ and $A^2$ are identical or different and are hydrogen or a $C_1$- to $C_{20}$-carbon-containing group; and n is from 5 to 50,000;

which comprises the steps of a) reacting at least one monomer of the formula (II)

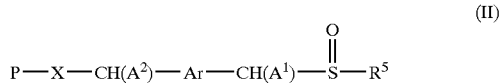

in which

X is a leaving group, and $R^5$ is unbranched alkyl having 1 to 20 carbon atoms, branched alkyl having 3 to 20 carbon atoms, cyclic alkyl or $C_1$–$C_4$-alkyl-substituted cyclic alkyl, which is optionally substituted or unsubstituted and/or contain heteroatoms, such as O, N and Si, P represents para in respect of the two methylene radicals —$CH(A^1)$— and —$CH(A^2)$— on both sides of the radical Ar, in which Ar, $A^1$ and $A^2$ are defined above, which is dissolved in an alcohol as a solvent, with a base, to give the compound of the formula (III)

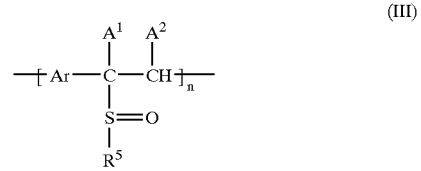

in which Ar, $A^1$, $A^2$, $R^5$ and n are as defined above, b) warming of the compound of the formula (III) with formation of a polymeric compound of the formula (I), which comprises employing a secondary or tertiary alcohol having at least 4 carbon atoms as the alcohol in step a).

2. The process as claimed in claim 1, wherein Ar in the compounds of the formula (I) is the structural unit

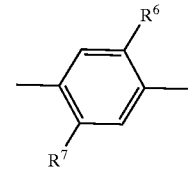

wherein $R^6$ and $R^7$ are identical or different and are hydrogen, an unbranched alkyl or alkoxy radical having 1 to 20 carbon atoms, a branched alkyl or alkoxy radical having 1 to 20 carbon atoms, phenyl or benzyl, wherein the above-mentioned radicals are unsubstituted or substituted, halogen, cyano, nitro, or an ester having 1 to 20 carbon atoms.

3. The process as claimed in claim 1, wherein Ar in the compounds of the formula (I) is the structural unit

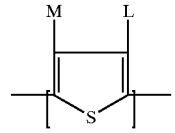

in which

M and L are identical or different and are hydrogen, an unbranched alkyl or alkoxy radical having 1 to 16 carbon atoms, a branched alkyl or alkoxy radical having 3 to 16 carbon atoms, phenyl or benzyl, where the above-mentioned radicals are unsubstituted or substituted, halogen, cyano, nitro, or an ester having 1 to 16 carbon atoms, or M and L together are a bridge having at least 4 bridge members, which optionally contain one or more heteroatoms.

4. The process as claimed in claim 1, wherein a secondary and/or tertiary alcohol is employed whose boiling point at atmospheric pressure is <300° C.

5. The process as claimed in claim 4, wherein the alcohol is s-butanol, 2-pentanol, 3-pentanol, 3-methyl-2-butanol, 2-methyl-2-butanol, 2,3-butanediol, 2-octanol, 3-octanol, 2-methyl-2-hexanol, 2-methyl-3-hexanol, 5-methyl-2-hexanol, cyclohexanol, regio- and stereoisomers of methylcyclohexanol, 1-methylcyclohexanol, t-butanol or 2-phenyl-2-propanol or a mixture thereof.

6. The process as claimed in claim 2, wherein $R^6$ and $R^7$ are identical or different and are hydrogen, an unbranched alkyl or alkoxy radical having 1 to 20 carbon atoms, a branched alkyl or alkoxy radical having 1 to 20 carbon atoms, phenyl or benzyl, wherein the above-mentioned radicals are unsubstituted or substituted, chlorine, bromine, fluorine, cyano, nitro, or an ester having 1 to 20 carbon atoms.

7. The process as claimed in claim 3, wherein

M and L are identical or different and are hydrogen, an unbranched alkyl or alkoxy radical having 1 to 16 carbon atoms, a branched alkyl or alkoxy radical having 3 to 16 carbon atoms, phenyl or benzyl, where the above-mentioned radicals are unsubstituted or substituted, chlorine, bromine, fluorine, cyano, nitro, or an ester having 1 to 16 carbon atoms, or M and L together are a bridge having at least 4 bridge members, which optionally contain oxygen, sulfur or oxygen and sulfur.

8. The process as claimed in claim 2, wherein a secondary and/or tertiary alcohol is employed whose boiling point at atmospheric pressure is <300° C.

9. The process as claimed in claim 3, wherein a secondary and/or tertiary alcohol is employed whose boiling point at atmospheric pressure is <300° C.

10. The process as claimed in claim 2, wherein the alcohol is s-butanol, 2-pentanol, 3-pentanol, 3-methyl-2-butanol, 2-methyl-2-butanol, 2,3-butanediol, 2-octanol, 3-octanol, 2-methyl-2-hexanol, 2-methyl-3-hexanol, 5-methyl-2-hexanol, cyclohexanol, regio- and stereoisomers of methylcyclohexanol, 1-methylcyclohexanol, t-butanol or 2-phenyl-2-propanol or a mixture thereof.

11. The process as claimed in claim 3, wherein the alcohol is s-butanol, 2-pentanol, 3-pentanol, 3-methyl-2-butanol, 2-methyl-2-butanol, 2,3-butanediol, 2-octanol, 3-octanol, 2-methyl-2-hexanol, 2-methyl-3-hexanol, 5-methyl-2-hexanol, cyclohexanol, regio- and stereoisomers of methylcyclohexanol, 1-methylcyclohexanol, t-butanol or 2-phenyl-2-propanol or a mixture thereof.

12. A process as claimed in claim 1, wherein $R^6$ and $R^7$ independently of one another are an unbranched alkoxy radical having 1 to 10 carbon atoms, a branched alkoxy radical having 3 to 20 carbon atoms, or phenyl, which is optionally substituted by one ore more branched or unbranched alkyl or alkoxy groups having up to 20 carbon atoms.

13. The process as claimed in claim 1, wherein $R^5$ is n-butyl, i-butyl, s-butyl, t-butyl, i-pentyl, octyl, 3,6,9-trioxadecyl, 2-hydroxyethyl or 2-chloroethyl.

14. The process as claimed in claim 4, wherein $R^5$ is n-butyl or n-octyl.

15. The process as claimed in claim 5, wherein the alcohol is t-butanol.

16. The process as claimed in claim 5, wherein step b is carried out in the presence of a solvent.

17. The process as claimed in claim 16, wherein said solvent is toluene.

18. The process as claimed in claim 1, wherein the 0.85 to 1.6 equivalents of base per mole of monomer of the formula (II).

19. The process as claimed in claim 1, wherein the 0.95 to 1.05 equivalents of base per mole of monomer of the formula (II).

20. A process for the preparation of polymers of the formula (I)

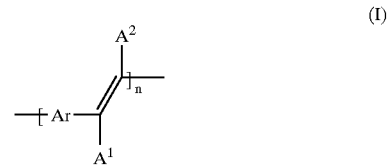

in which Ar is $Ar^1$ or $Ar^2$ and $Ar^1$ is an aromatic ring system having 4 to 20 carbon atoms, which is optionally monosubstituted or polysubstituted by $C_1$–$C_{20}$-alkyl, $C_1$–$C_{20}$-alkoxy, $C_3$–$C_{20}$-branched alkyl, phenyl or benzyl radicals and which further optionally contains up to 4 heteroatoms selected from the group consisting of oxygen, sulfur and nitrogen in the aromatic ring system, is a radical of the formula

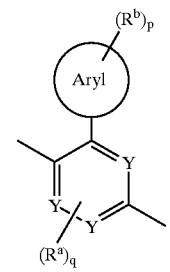

in which

Y are identical or different and are CH or N;

Aryl is an aryl group having 4 to 14 carbon atoms;

$R^a$ and $R^b$ are identical or different and are a straight-chain or branched or cyclic alkyl or alkoxy group having 1 to 20 carbon atoms, in which one or more non-adjacent $CH_2$ groups is optionally replaced by —O—, —S—, —CO—, —COO—, —O—CO—, —$NR^1$—, —$(NR^2R^3)^+$—$A^-$ or —$CONR^4$— and in which one or more H atoms is optionally replaced by F, or are CN, F, Cl or an aryl group having 4 to 14 carbon atoms, which is optionally substituted by one or more non-aromatic radicals $R^a$;

$R^1$, $R^2$, $R^3$ and $R^4$ are identical or different and are aliphatic or aromatic hydrocarbon radicals having 1 to 20 carbon atoms or are alternatively H;

$A^-$ is a singly charged anion or an equivalent thereof;

q is 0, 1 or 2;

p is 1, 2, 3, 4 or 5;

$A^1$ and $A^2$ are identical or different and are hydrogen or a $C_1$- to $C_{20}$-carbon-containing group; and n is from 5 to 50,000;

which comprises the steps of a) reacting at least one monomer of the formula (II)

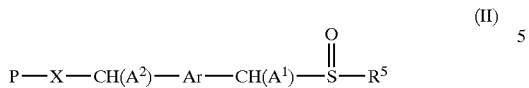 (II)

in which

X is a leaving group, and $R^5$ is unbranched alkyl having 1 to 20 carbon atoms, branched alkyl having 3 to 20 carbon atoms, cyclic alkyl or $C_1$–$C_4$-alkyl-substituted cyclic alkyl, which is optionally substituted or unsubstituted and/or contain heteroatoms, such as O, N and Si, P represents para in respect of the two methylene radicals —CH($A^1$)— and —CH($A^2$)— on both sides of the radical Ar, in which Ar, $A^1$ and $A^2$ are defined above, which is dissolved in an alcohol as a solvent, with a base to give the compound of the formula (III)

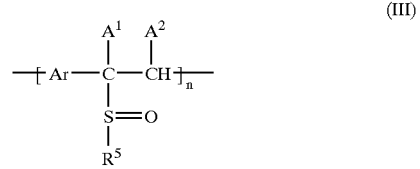 (III)

in which Ar, $A^1$, $A^2$, $R^5$ and n are as defined above, b) warming of the compound of the formula (III) with formation of a polymeric compound of the formula (I), which comprises employing a secondary or tertiary alcohol having at least 4 carbon atoms as the alcohol in step a) and said base and said alcohol are different components in step a).

* * * * *

UNITED STATES PATENT AND TRADEMARK OFFICE
CERTIFICATE OF CORRECTION

PATENT NO. : 6,936,683 B1
DATED : August 30, 2005
INVENTOR(S) : Dirk Vanderzande et al.

It is certified that error appears in the above-identified patent and that said Letters Patent is hereby corrected as shown below:

<u>Column 14,</u>
Line 1, "which is dissolved in an alcohol as a solvent, with a base" should read
-- which is dissolved in an alcohol as a solvent, with a base, --.

Signed and Sealed this

Twenty-seventh Day of December, 2005

JON W. DUDAS
*Director of the United States Patent and Trademark Office*